US012804974B2

(12) United States Patent
Ju et al.

(10) Patent No.: US 12,804,974 B2

(45) Date of Patent: Nov. 17, 2026

(54) INTEGRATED CIRCUIT DEVICES

(71) Applicant: Samsung Electronics Co., Ltd., Suwon-si (KR)

(72) Inventors: Jungmin Ju, Suwon-si (KR); Chansic Yoon, Suwon-si (KR); Gyuhyun Kil, Suwon-si (KR); Junghoon Han, Suwon-si (KR); Weonhong Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 367 days.

(21) Appl. No.: 18/409,269

(22) Filed: Jan. 10, 2024

(65) Prior Publication Data

US 2024/0274664 A1 Aug. 15, 2024

(30) Foreign Application Priority Data

Feb. 15, 2023 (KR) ........................ 10-2023-0020123

(51) Int. Cl.
*H10D 62/13* (2025.01)
*H10B 12/00* (2023.01)

(52) U.S. Cl.
CPC ........... *H10D 62/151* (2025.01); *H10B 12/50* (2023.02)

(58) Field of Classification Search
CPC ........ H10B 12/50; H10B 12/31; H10B 12/30; H10D 30/62; H10D 30/024; H10D 64/021; H10D 30/6219; H10D 62/832; H10D 64/514; H10D 64/62; H10D 62/151; H10D 84/0149; H10D 84/0158; H10D 84/038; H10D 84/834; H10D 64/254; H10D 64/256; H10W 20/20
See application file for complete search history.

(56) References Cited

U.S. PATENT DOCUMENTS

| | | | |
|---|---|---|---|
| 7,719,062 B2 | 5/2010 | Fischer et al. | |
| 8,012,820 B2 | 9/2011 | Majumdar et al. | |
| 8,124,473 B2 | 2/2012 | Pan et al. | |
| 8,785,285 B2 | 7/2014 | Tsai et al. | |
| 8,901,537 B2 | 12/2014 | Murthy et al. | |
| 8,975,672 B2 * | 3/2015 | Chiang ............. | H10D 30/0212 438/293 |

(Continued)

FOREIGN PATENT DOCUMENTS

| | | |
|---|---|---|
| EP | 02656393 A4 | 9/2014 |

OTHER PUBLICATIONS

Extended European Search Report dated Jul. 25, 2024 issued in European Patent Application No. 24156348.5-1211.

*Primary Examiner* — Victor A Mandala

(74) *Attorney, Agent, or Firm* — HARNESS, DICKEY & PIERCE, P.L.C.

(57) ABSTRACT

An integrated circuit device includes a gate stack on a substrate, a spacer on first and second sidewalls of the gate stack, a source/drain area in an upper portion of the substrate on first and second sides of the gate stack, a cover semiconductor layer on the source/drain area, an interlayer insulating film on the cover semiconductor layer and surrounding sidewalls of the gate stack, and a contact in a contact hole that penetrates the interlayer insulating film and the cover semiconductor layer, the contact having a bottom portion contacting the cover semiconductor layer and the source/drain area.

20 Claims, 21 Drawing Sheets

(56) References Cited

U.S. PATENT DOCUMENTS

| | | | | |
|---|---|---|---|---|
| 9,012,964 | B2 * | 4/2015 | Kwok | H10D 30/0213 257/285 |
| 9,209,175 | B2 * | 12/2015 | Sung | H10D 30/022 |
| 9,224,735 | B2 | 12/2015 | Glass et al. | |
| 9,401,360 | B2 | 7/2016 | Kim et al. | |
| 9,484,432 | B2 | 11/2016 | Glass et al. | |
| 9,564,332 | B2 * | 2/2017 | Hsieh | H10D 62/021 |
| 9,831,183 | B2 * | 11/2017 | Lin | H10D 64/0112 |
| 9,922,978 | B2 * | 3/2018 | Ching | H10D 30/024 |
| 11,380,619 | B2 | 7/2022 | Koike et al. | |
| 2017/0053916 | A1 * | 2/2017 | Ching | H10D 30/024 |
| 2018/0190810 | A1 | 7/2018 | Li et al. | |
| 2019/0081158 | A1 * | 3/2019 | Riegler | H10D 12/441 |
| 2019/0097006 | A1 * | 3/2019 | Li | H10D 30/0212 |
| 2019/0164957 | A1 * | 5/2019 | Meng | H10D 84/811 |
| 2019/0311945 | A1 | 10/2019 | Chan et al. | |
| 2019/0393347 | A1 | 12/2019 | Kim et al. | |
| 2021/0119037 | A1 | 4/2021 | Li et al. | |
| 2022/0093757 | A1 * | 3/2022 | Huang | H10D 64/021 |
| 2022/0157955 | A1 * | 5/2022 | Park | H10D 30/6219 |
| 2022/0190109 | A1 * | 6/2022 | Choi | H10D 30/014 |
| 2022/0344508 | A1 | 10/2022 | Huang et al. | |
| 2023/0261079 | A1 * | 8/2023 | Song | H10D 30/6735 257/288 |
| 2024/0304666 | A1 * | 9/2024 | Kim | H10D 30/014 |
| 2025/0267900 | A1 * | 8/2025 | Chang | H10D 30/751 |
| 2026/0006851 | A1 * | 1/2026 | Seo | H10B 12/50 |

* cited by examiner

INTEGRATED CIRCUIT DEVICES

CROSS-REFERENCE TO RELATED APPLICATION

This application is based on and claims priority under 35 U.S.C. § 119 to Korean Patent Application No. 10-2023-0020123, filed on Feb. 15, 2023, in the Korean Intellectual Property Office, the disclosure of which is incorporated by reference herein in its entirety.

BACKGROUND

Various example embodiments relate to an integrated circuit device and/or a manufacturing method thereof, and more particularly, to an integrated circuit device including a peripheral circuit and/or a manufacturing method thereof.

According to the downscaling of a semiconductor device, the size of individual fine circuit patterns for implementing the semiconductor device is further reduced. In addition, as the size of individual microcircuit patterns decreases, the size of contacts also decreases, and as a result, contact resistance increases and electrical performance, such as speed and/or power performance, deteriorates.

SUMMARY

Various example embodiments provide an integrated circuit device capable of reducing contact resistance and/or a manufacturing method thereof.

According to some example embodiments, there is provided an integrated circuit device including a gate stack on a substrate, a spacer on first and second sidewalls of the gate stack, a source/drain area in an upper portion of the substrate on first and second sides of the gate stack, a cover semiconductor layer on the source/drain area, an interlayer insulating film on the cover semiconductor layer and surrounding the sidewalls of the gate stack, and a contact in a contact hole that penetrates the interlayer insulating film and the cover semiconductor layer, the contact having a bottom portion contacting the cover semiconductor layer and the source/drain area.

Alternatively or additionally according to some example embodiments, there is provided an integrated circuit device including a gate stack on a substrate, the gate stack including a gate insulating layer, a gate electrode, and a gate capping layer, a spacer including an inner spacer and an outer spacer that are sequentially arranged on first and second sidewalls of the gate stack, a source/drain area on at least one side of the gate stack and within an upper portion of the substrate, a cover semiconductor layer on the source/drain area and contacting at least a portion of the spacer, an interlayer insulating film on the cover semiconductor layer and an outer wall of the spacer, and a contact electrically connected to the cover semiconductor layer and the source/drain area, the contact penetrating through the interlayer insulating film.

Alternatively or additionally according to various example embodiments, there is provided an integrated circuit device including an element isolation film on the substrate and defining an active area, a gate stack on the active area of the substrate, the gate stack including a gate insulating layer, a gate electrode, and a gate capping layer, a spacer on first and second sidewalls of the gate stack, a source/drain area on at least one side of the gate stack and within the active area, a cover semiconductor layer on the source/drain area, the cover semiconductor layer including silicon germanium, and contacting at least a portion of the spacer, an interlayer insulating film on the cover semiconductor layer and on outer walls of the spacer, and a contact electrically connected to the cover semiconductor layer and the source/drain area, the contact penetrating through the interlayer insulating film.

Alternatively or additionally according to some example embodiments, there is provided an integrated circuit device including a gate stack on a substrate, a source/drain area on at least one side of the gate stack and disposed n an upper portion of the substrate, a spacer on first and second sidewalls of the gate stack, a cover semiconductor layer on the source/drain area on the substrate, an interlayer insulating film on an upper surface of the cover semiconductor layer and an outer wall of the spacer, and a contact electrically connected to the cover semiconductor layer, the contact penetrating through the interlayer insulating film.

Alternatively or additionally according to some example embodiments, there is provided an integrated circuit device including a channel layer on a substrate, a gate stack on the channel layer, a source/drain area on at least one side of the gate stack and in an upper portion of the substrate, a spacer on first and second sidewalls of the gate stack, a cover semiconductor layer on the source/drain area on the substrate and integrally connected to the channel layer, an interlayer insulating film on an upper surface of the cover semiconductor layer and on an outer wall of the spacer, and a contact electrically connected to the source/drain area, the contact penetrating through the interlayer insulating film.

BRIEF DESCRIPTION OF THE DRAWINGS

Various example embodiments will be more clearly understood from the following detailed description taken in conjunction with the accompanying drawings in which.

DETAILED DESCRIPTION OF SOME EXAMPLE EMBODIMENTS

Hereinafter, some example embodiments of technical ideas of inventive concepts will be described in detail with reference to the accompanying drawings.

Figure 1:
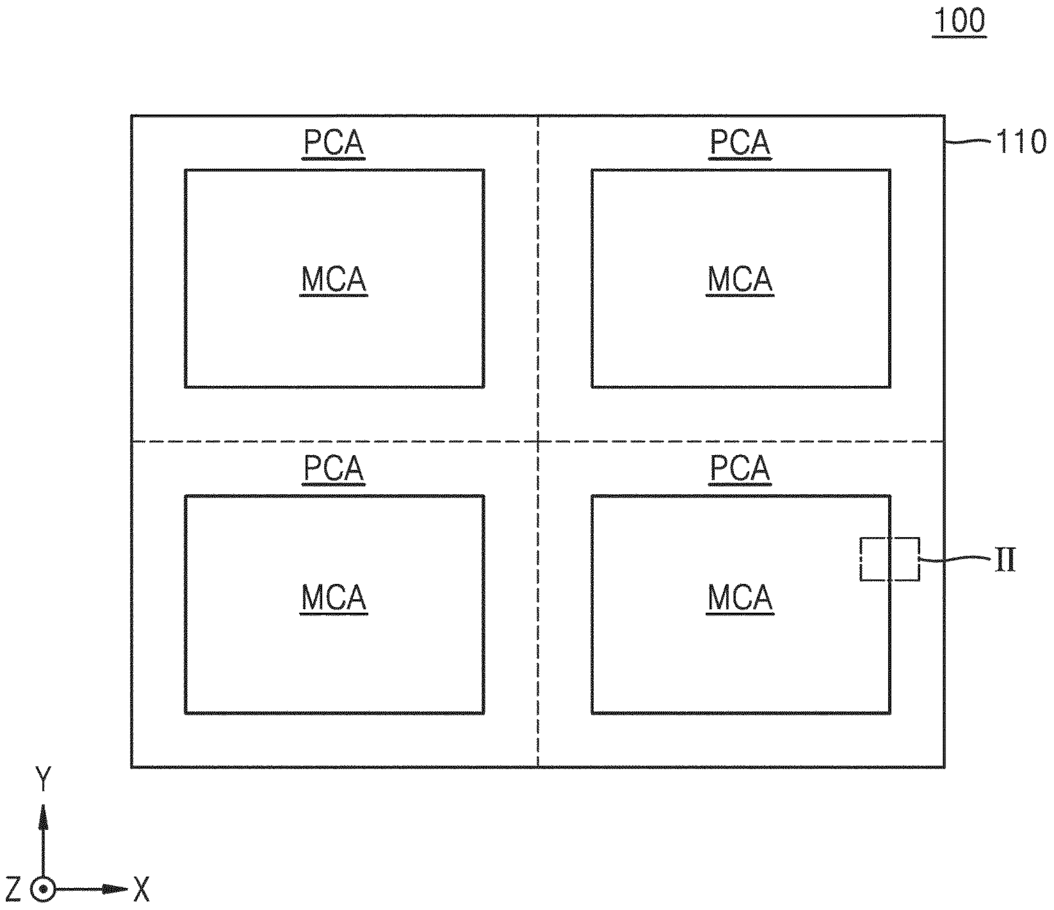
FIG. 1 is a layout diagram illustrating a semiconductor device according to some example embodiments.
Figure 2:
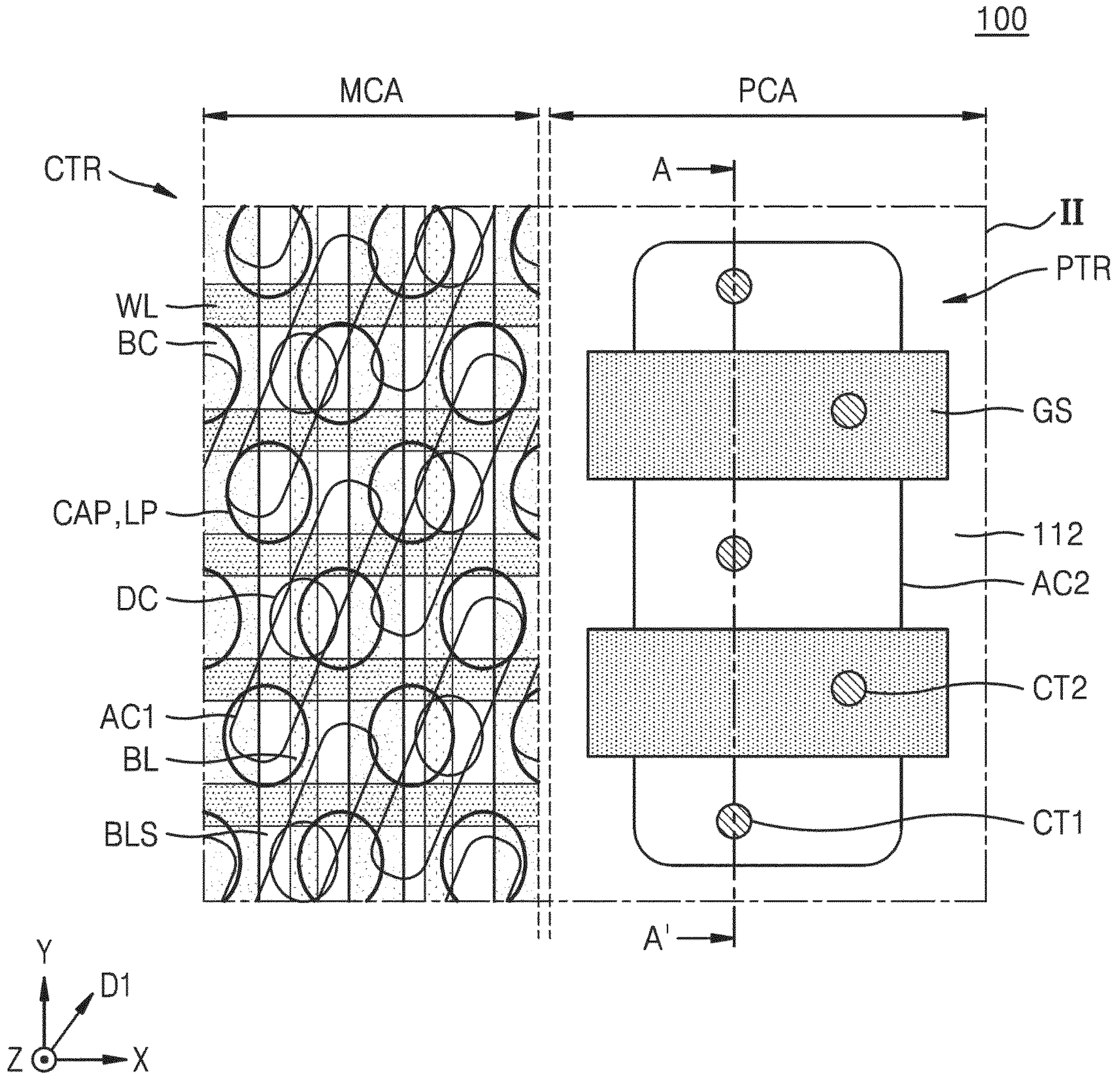
FIG. 2 is an enlarged layout diagram of a part II of FIG. 1.
Figure 3:
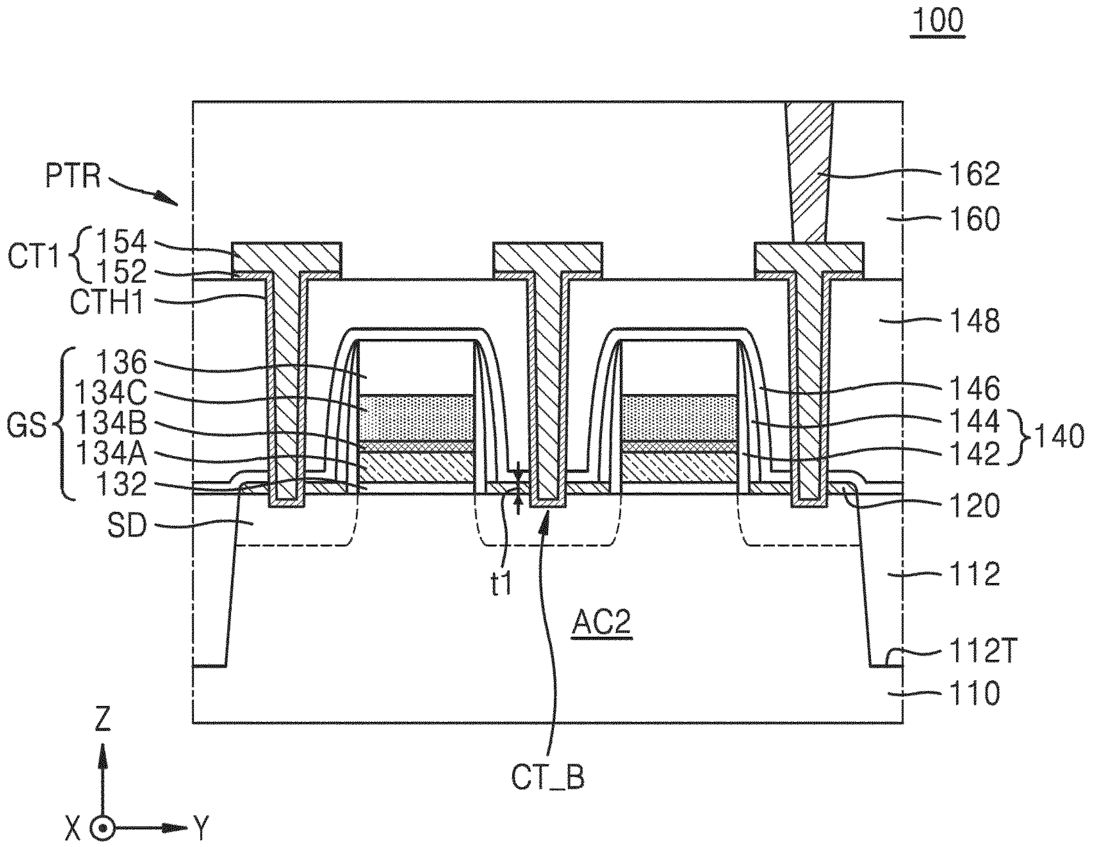
FIG. 3 is a cross-sectional view taken along line A-A' of FIG. 2.

FIG. 1 is a layout diagram illustrating an integrated circuit device 100 according to various example embodiments. FIG. 2 is an enlarged layout diagram of a part II of FIG. 1. FIG. 3 is a cross-sectional view taken along line A-A' of FIG. 2.

Referring to FIGS. 1 to 3, the integrated circuit device 100 may include a substrate 110 including a cell array area MCA and a peripheral circuit area PCA. The cell array area MCA may be or may include a memory cell area of a dynamic random-access memory (DRAM) device, and the peripheral circuit area PCA may be or may include a core area and/or a peripheral circuit area of the DRAM device. For example, the cell array area MCA may include a cell transistor CTR and a cell capacitor CAP, and the peripheral circuit area PCA may include a peripheral circuit transistor PTR for transmitting a signal and/or power to the cell transistor CTR included in the cell array area MCA. In some example embodiments, the peripheral circuit transistor PTR may configure various circuits such as a command decoder, a control logic, an address buffer, a row decoder, a column decoder, a sense amplifier, and a data input/output circuit. In some example embodiments, the peripheral circuit transistor PTR may be or may include an NMOS transistor or a PMOS transistor. In some example embodiments, the peripheral transistor PTR may be a planar transistor; however, example embodiments are not limited thereto.

An element isolation trench 112T may be formed in the substrate 110, and an element isolation film 112 may be formed in the element isolation trench 112T. In some example embodiments, the element isolation film 112 may be or may include a shallow trench isolation (STI) film; however, example embodiments are not limited thereto. In the cell array area MCA, a plurality of first active areas AC1 may be defined on the substrate 110 by the element isolation film 112, and a plurality of second active areas AC2 may be defined on the substrate 110 in the peripheral circuit area PCA.

In the cell array area MCA, the plurality of first active areas AC1 may be arranged to have long axes in diagonal directions D1 inclined with respect to the first horizontal direction X and the second horizontal direction Y, respectively. In some example embodiments, the diagonal direction D1 may be inclined at an angle of, for example, more than 45 degrees with respect to the first horizontal direction X; however, example embodiments are not limited thereto. A plurality of word lines WL may extend parallel to each other in the first horizontal direction X across the plurality of first active areas AC1. In some example embodiments, the cell transistor CTR may have a buried channel array transistor (BCAT) structure, and for example, the plurality of word lines WL may be disposed in word line trenches extending in the first horizontal direction X inside the substrate 110.

A plurality of bit lines BL may extend parallel to each other in the second horizontal direction Y on the plurality of word lines WL. The plurality of bit lines BL may be connected to the plurality of first active areas AC1 through digit line contacts or direct contacts DC. Bit line spacers BLS may be disposed on first and second, or both, sidewalls of each of the plurality of bit lines BL. A plurality of buried contacts BC may be formed between two adjacent bit lines BL among the plurality of bit lines BL. The plurality of buried contacts BC may be arranged in a row in the first horizontal direction X and the second horizontal direction Y.

A plurality of landing pads LP may be formed on the plurality of buried contacts BC. A memory unit such as but not limited to a cell capacitor CAP may be disposed at a position vertically overlapping the plurality of landing pads LP. For example, the cell capacitor CAP may include a metal-insulator-metal (MIM) capacitor including a lower electrode, an upper electrode, and a capacitor dielectric layer therebetween. In some example embodiments, the cell capacitor CAP may be or may include a memory cell having memristor and/or hysteresis properties; example embodiments are not limited thereto.

The substrate 110 may include silicon, for example, one or more of single crystal silicon, polycrystalline silicon, or amorphous silicon. Alternatively or additionally in some example embodiments, the substrate 110 may include at least one selected from Ge, SiGe, SiC, GaAs, InAs, and InP. In some example embodiments, the substrate 110 may include a conductive area, for example, a well doped with or having incorporated therein an impurity and/or a structure doped with an impurity. The element isolation film 112 may include an oxide film, a nitride film, or a combination thereof.

A peripheral circuit transistor PTR may be disposed on the second active area AC2 in the peripheral circuit area PCA. The peripheral circuit transistor PTR may include a gate stack GS disposed on the second active area AC2, source/drain areas SD disposed on both sides of the gate stack GS, and a cover semiconductor layer 120 disposed on the source/drain area SD. Although the peripheral circuit transistor PTR is illustrated as extending in the X direction, example embodiments are not limited thereto, and at least one peripheral circuit transistor may extend in another direction, e.g., in the Y direction.

The source/drain area SD may be disposed on both sides of the gate stack GS in an upper portion of the second active area AC2. The source/drain area SD may be or may include or be included in an area of the substrate 110 doped with impurities and may include, for example, silicon doped with impurities and/or having impurities incorporated therein. In some embodiments, the impurity doped in the source/drain area SD may include boron (B); however, example embodiments are not limited thereto.

The gate stack GS may include a gate insulating layer 132, a first gate electrode 134A, a second gate electrode 134B, a third gate electrode 134C, and a gate capping layer 136. The gate insulating layer 132 may be formed of or include at least one selected from among a silicon oxide film, a silicon nitride film, a silicon oxide nitride film, oxide/nitride/oxide (ONO), and a high-k dielectric film having a higher dielectric constant than the silicon oxide film. The gate capping layer 136 may include a silicon nitride film.

In some example embodiments, the first gate electrode 134A may include Si, Ge, W, WN, Co, Ni, Al, Mo, Ru, Ti, TiN, Ta, TaN, Cu, La, or a combination thereof. The second gate electrode 134B and the third gate electrode 134C may independently or concurrently include TiN, TiSiN, W, tungsten silicide, or a combination thereof.

In some example embodiments, a constituent material of each of the first gate electrode 134A, the second gate electrode 134B, and the third gate electrode 134C may be the same as that of the bit line BL in the cell array area MCA. For example, the first gate electrode 134A, the second gate electrode 134B, and the third gate electrode 134C may be simultaneously formed in a process of forming the bit line BL. However, example embodiments are not limited thereto.

First and second, e.g., both, sidewalls of the gate stack GS may be covered with a spacer 140. The spacer 140 may include an inner spacer 142 and an outer spacer 144. For example, the inner spacer 142 may be directly disposed on both sidewalls of the gate stack GS and may include a first insulating material. The outer spacer 144 may be disposed on the inner spacer 142 on both sidewalls of the gate stack GS and may include a second insulating material, wherein the second insulating material is different from or does not include any common material included in the first insulating material. The inner spacer 142 may be disposed between the outer spacer 144 and the gate stack GS so that the outer spacer 144 may not directly contact the sidewall of the gate stack GS. In some example embodiments, the first insulating material may include silicon nitride and may not include silicon oxide, and the second insulating material may include silicon oxide and may not include silicon nitride.

The cover semiconductor layer 120 may be disposed to contact the outer wall of the inner spacer 142 on the upper surface of the source/drain area SD and may cover the entire upper surface of the portion of the second active area AC2 not covered by the gate stack GS. In some example embodiments, the cover semiconductor layer 120 may include silicon germanium (SiGe), such as but not limited to single-crystal SiGe. Here, that the cover semiconductor layer 120 includes silicon germanium (SiGe) refers to that the elements constituting the cover semiconductor layer 120 are silicon and germanium, and contents of each of silicon and germanium included in the cover semiconductor layer 120 may vary. For example, a stoichiometric ratio between silicon and germanium included in the cover semiconductor layer 120 may be greater than 0% and less than 100%, e.g., may be 10%, 20%, 30%, 40%, 50%, 60%, 70%, 80%, or 90%, and may be constant throughout a thickness direction of the cover semiconductor layer 120, or may vary in a thickness direction of the cover semiconductor layer 120.

In some example embodiments, the cover semiconductor layer 120 may be formed by performing an epitaxial growth process on the source/drain area SD. In some example embodiments, the source/drain area SD may be silicon and may not include germanium, while the cover semiconductor layer 120 may include silicon and germanium, e.g., may be a heterogenous epitaxial layer of SiGe. With the inner spacer 142 formed on both sidewalls of the gate stack GS, the cover semiconductor layer 120 may be formed by using an upper surface of a portion of the second active area AC2 not covered by the gate stack GS and the inner spacer 142 as a seed layer. Accordingly, the cover semiconductor layer 120 may contact the outer wall of the inner spacer 142 and may not be disposed on the element isolation film 112. In some example embodiments, the cover semiconductor layer 120 may have a first thickness t1 of 100 angstroms or less in the vertical direction Z; however, example embodiments are not limited thereto.

The gate stack GS and the spacer 140 may be covered by a protective layer 146, and a first interlayer insulating film 148 may be disposed on the protective layer 146 to cover sidewalls of the gate stack GS and the spacer 140.

In some example embodiments, the cover semiconductor layer 120 may contact the outer wall of the inner spacer 142, and a bottom surface of the outer spacer 144 may be disposed on an upper surface of the cover semiconductor layer 120. For example, the bottom surface of the outer spacer 144 may be at a level higher than or be above the bottom surface of the inner spacer 142, and a portion of the cover semiconductor layer 120 may vertically overlap the outer spacer 144. An upper surface of the cover semiconductor layer 120 may be covered by a protective layer 146 and the first interlayer insulating film 148.

In the peripheral circuit area PCA, a contact CT1 may be disposed in a contact hole CTH1 penetrating the first interlayer insulating film 148, the protective layer 146, and the cover semiconductor layer 120. The contact CT1 may include a conductive barrier 152 and a contact conductive layer 154. In some example embodiments, the conductive barrier 152 may include at least one of ruthenium (Ru), titanium (Ti), titanium nitride (TiN), tantalum (Ta), tantalum nitride (TaN), tungsten (W), titanium silicon nitride (TiSiN), titanium silicide (TiSi), and tungsten silicide (WSi). The contact conductive layer 154 may include at least one of tungsten (W), cobalt (Co), molybdenum (Mo), nickel (Ni), ruthenium (Ru), copper (Cu), aluminum (Al), silicides thereof, or alloys thereof.

The bottom portion CT_B of the contact CT1 may contact the source/drain area SD, and sidewalls of the bottom portion of the contact CT1 may be covered by the cover semiconductor layer 120. A bottom surface of the contact CT1 may be at a level lower than a bottom surface of the cover semiconductor layer 120.

As shown in FIG. 2, a gate contact CT2 may be disposed to be connected to the gate stack GS, and for example, the gate contact CT2 may pass through the protective layer 146, the first interlayer insulating film 148, and the gate capping layer 136 to be electrically connected to the upper surface of the third gate electrode 134C. A second interlayer insulating film 160 may be disposed on the first interlayer insulating film 148, and an upper contact 162 may be disposed through the second interlayer insulating film 160 and connected to the contact CT1.

According to various example embodiments, compared to silicon such as single-crystal silicon, since the cover semiconductor layer 120 including silicon germanium disposed on the source/drain area SD has a small carrier diffusivity (e.g., diffusivity of impurities such as boron (B) included in the cover semiconductor layer 120), ohmic contact characteristics may be improved due to a further increased carrier concentration in the cover semiconductor layer 120, thereby reducing resistance of the contact CT1. This may improve electrical performance such as speed and/or power.

In some example embodiments, the peripheral circuit transistor PTR may include a PMOS transistor. Alternatively or additionally in some example embodiments, the peripheral circuit transistor PTR may include an NMOS transistor. In some example embodiments, the peripheral circuit transistor PTR may be a thin-gate transistor; alternatively or additionally in some example embodiments, the peripheral circuit transistor PTR may be a thick-gate transistor.

Figure 4:
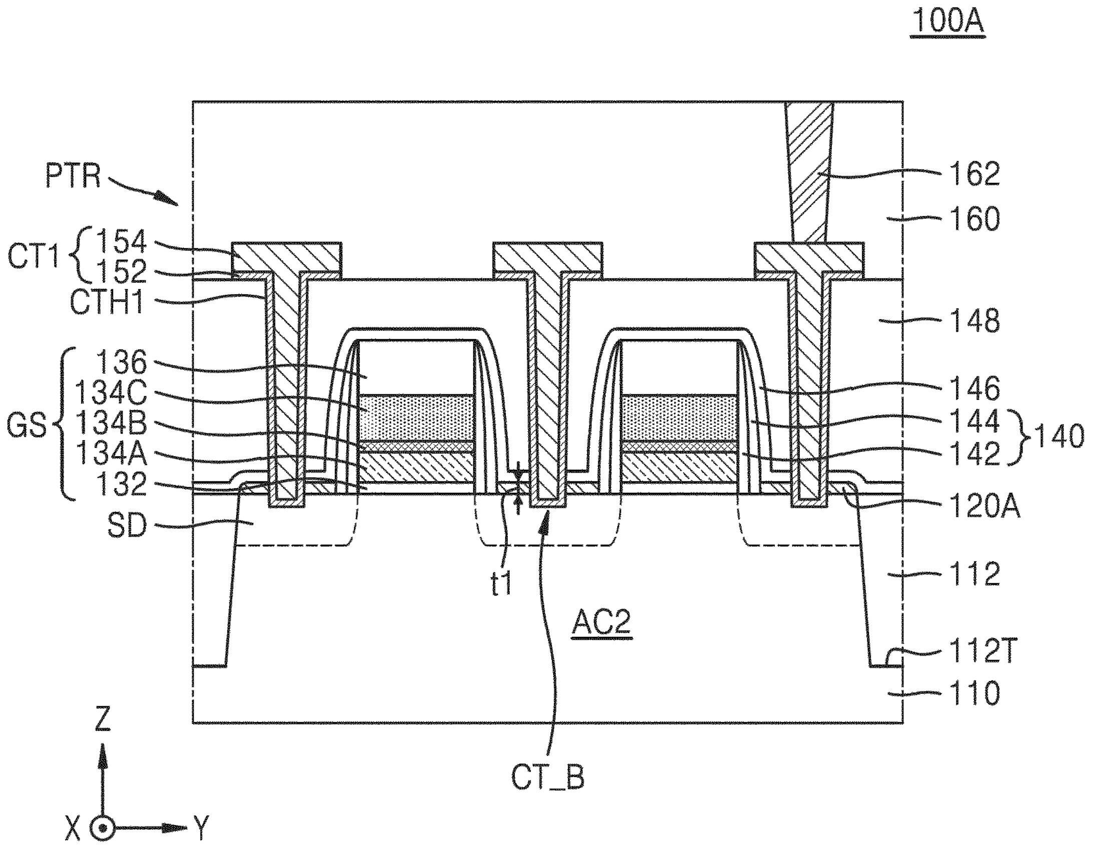
FIG. 4 is a cross-sectional view illustrating an integrated circuit device according to some example embodiments.

FIG. 4 is a cross-sectional view illustrating an integrated circuit device 100A according to various example embodiments.

Referring to FIG. 4, the cover semiconductor layer 120A may be disposed on the upper surface of the source/drain area SD and may contact the outer wall of the outer spacer 144. The bottom surface of the inner spacer 142 and the bottom surface of the outer spacer 144 contact the upper surface of the substrate 110 (e.g., the source/drain area SD), and the cover semiconductor layer 120A may be disposed not to vertically overlap the gate stack GS and the spacer 140. The cover semiconductor layer 120A may not contact the inner spacer 142.

In some example embodiments, with the inner spacer 142 and the outer spacer 144 formed on both sidewalls of the gate stack GS, a cover semiconductor layer 120A may be formed on the exposed upper surface of the second active area AC2 by an epitaxial growth process.

The contact CT1 may pass through the first interlayer insulating film 148, the protective layer 146, and the cover semiconductor layer 120A and may be disposed on the upper surface of the source/drain area SD. Compared to silicon such as single-crystal silicon, since the cover semiconductor layer 120A including silicon germanium disposed on the source/drain area SD has a small carrier diffusivity (e.g., diffusivity of impurities such as boron (B) included in the cover semiconductor layer 120A), ohmic contact characteristics may be improved due to a further increased carrier concentration in the cover semiconductor layer 120A, thereby reducing resistance of the contact CT1.

Figure 5:
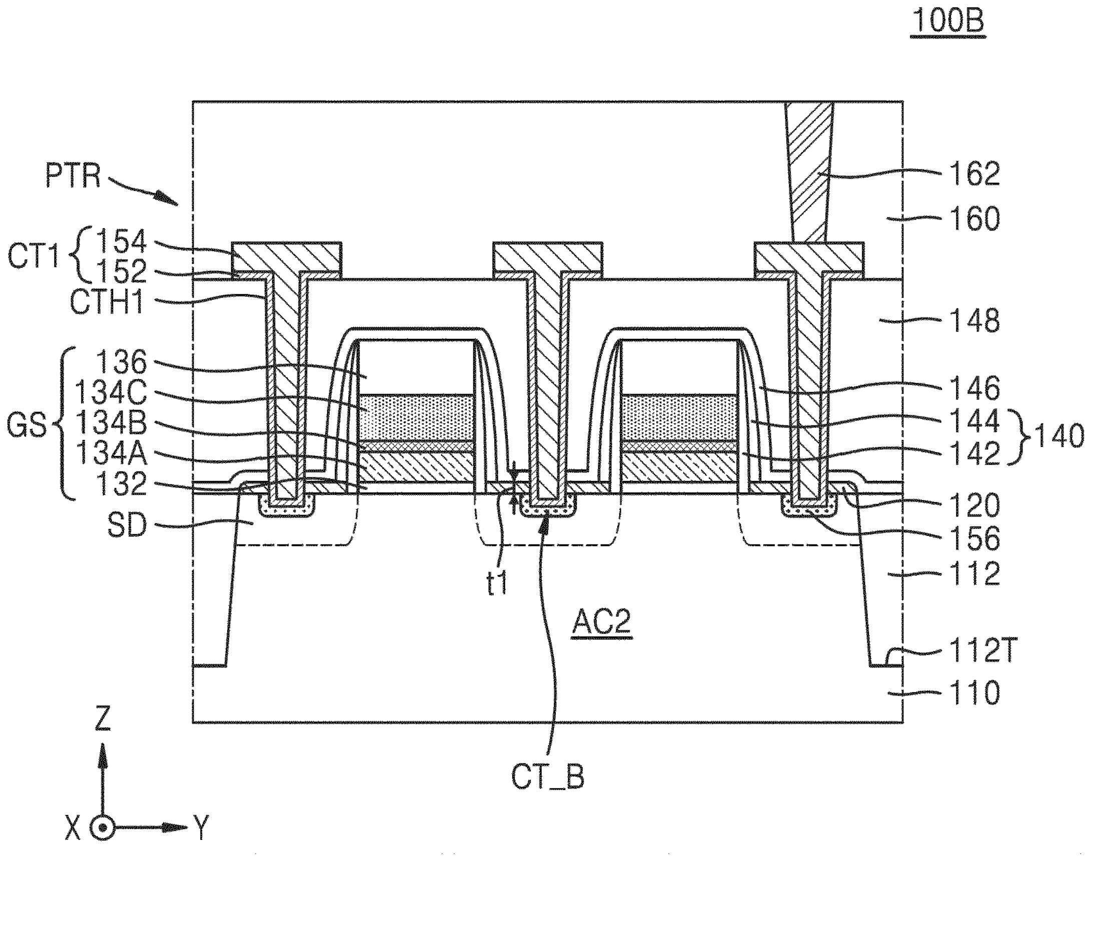
FIG. 5 is a cross-sectional view illustrating an integrated circuit device according to some example embodiments.

FIG. 5 is a cross-sectional view illustrating an integrated circuit device 100B according to various example embodiments.

Referring to FIG. 5, a metal silicide layer 156 may be disposed on the bottom portion of the contact hole CTH1, and the metal silicide layer 156 may include at least one of cobalt silicide, nickel silicide, tungsten silicide, and tantalum silicide. As the metal silicide layer 156 is disposed on the bottom portion of the contact hole CTH1, contact resistance between the source/drain area SD and the contact CT1 may be reduced.

Figure 6:
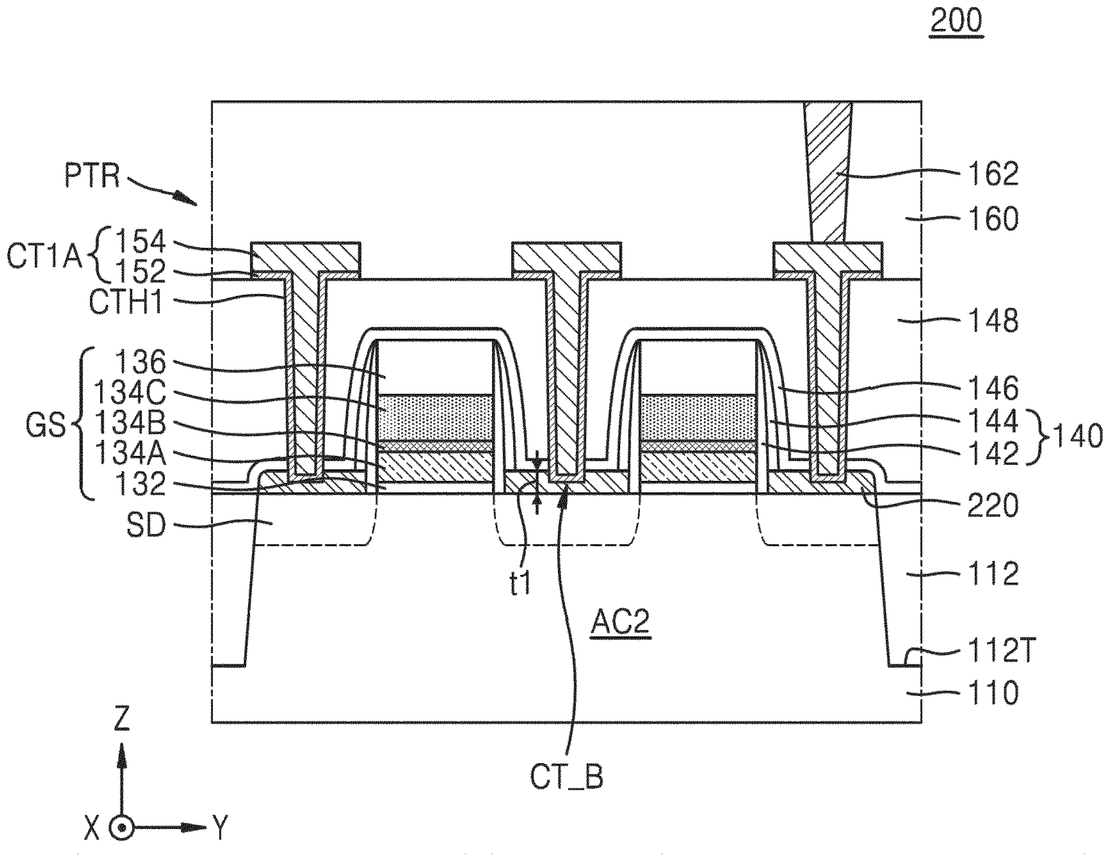
FIG. 6 is a cross-sectional view illustrating an integrated circuit device according to some example embodiments.

FIG. 6 is a cross-sectional view illustrating an integrated circuit device 200 according to some example embodiments.

Referring to FIG. 6, the contact hole CTH1 may pass through the first interlayer insulating film 148 and the protective layer 146, and an upper surface of the cover semiconductor layer 220 may be exposed at the bottom portion of the contact hole CTH1. A bottom surface of a contact CT1A may contact an upper surface of the cover semiconductor layer 220. A bottom surface of the contact CT1A may be at a level lower than an upper surface of the cover semiconductor layer 220 and higher than an upper surface of the source/drain area SD. The contact CT1A may be spaced apart from the source/drain area SD in the vertical direction Z without directly contacting the source/drain area SD.

In some example embodiments, the cover semiconductor layer 220 may have a thickness of about 50 angstroms to about 300 angstroms in the vertical direction Z. In some example embodiments, a concentration of germanium included in the cover semiconductor layer 220 may be constant, or may vary in the vertical direction Z. The cover semiconductor layer 220 may contact at least a portion of the spacer 140, and for example, the cover semiconductor layer 220 may contact the outer wall of the inner spacer 142 and a bottom surface of the outer spacer 144 may be disposed on an upper surface of the cover semiconductor layer 220.

In some example embodiments, the cover semiconductor layer 220 may be formed by performing an epitaxial growth process on the source/drain area SD. With the inner spacer 142 formed on both sidewalls of the gate stack GS, the cover semiconductor layer 220 may be formed by using an upper surface of a portion of the second active area AC2 not covered by the gate stack GS and the inner spacer 142 as a seed layer. Accordingly, the cover semiconductor layer 220 may contact the outer wall of the inner spacer 142 and may not be disposed on or directly on the element isolation film 112.

According to various example embodiments, compared to silicon, since the cover semiconductor layer 220 including silicon germanium disposed on the source/drain area SD has small carrier diffusivity (e.g., diffusivity of impurities such as boron (B) included in the cover semiconductor layer 220), and the bottom portion CT_B of the contact CT1A is surrounded by the cover semiconductor layer 220, resistance of the contact CT1A may be reduced.

Figure 7:
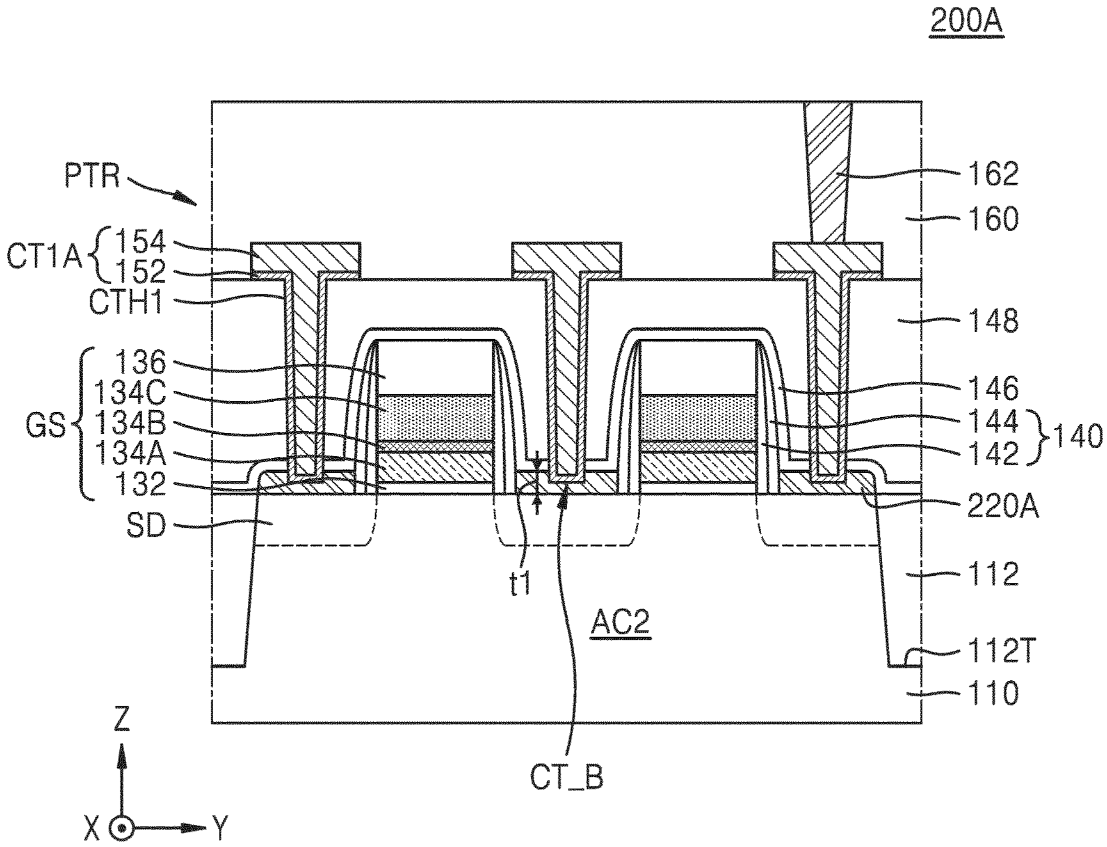
FIG. 7 is a cross-sectional view illustrating an integrated circuit device according to some example embodiments.

FIG. 7 is a cross-sectional view illustrating an integrated circuit device 200A according to various example embodiments.

Referring to FIG. 7, a cover semiconductor layer 220A may be disposed on the upper surface of the source/drain area SD and may contact the outer wall of the outer spacer 144. The bottom surface of the inner spacer 142 and the bottom surface of the outer spacer 144 contact the upper surface of the substrate 110 (e.g., the source/drain area SD), and the cover semiconductor layer 220A may be disposed not to vertically overlap the gate stack GS and the spacer 140. The cover semiconductor layer 220A may not contact the inner spacer 142.

In various example embodiments, with the inner spacer 142 and the outer spacer 144 formed on both sidewalls of the gate stack GS, a cover semiconductor layer 220A may be formed on the exposed upper surface of the second active area AC2 by an epitaxial growth process.

The contact CT1A may pass through the first interlayer insulating film 148 and the protective layer 146 and may be disposed on the upper surface of the cover semiconductor layer 220A. Compared to silicon, since the cover semiconductor layer 220A including silicon germanium disposed on the source/drain area SD has small carrier diffusivity (e.g., diffusivity of impurities such as B included in the cover semiconductor layer 220A), and the bottom portion CT_B of the contact CT1A is surrounded by the cover semiconductor layer 220A, resistance of the contact CT1A may be reduced. This may improve electrical performance such as speed and/or power.

Figure 8:
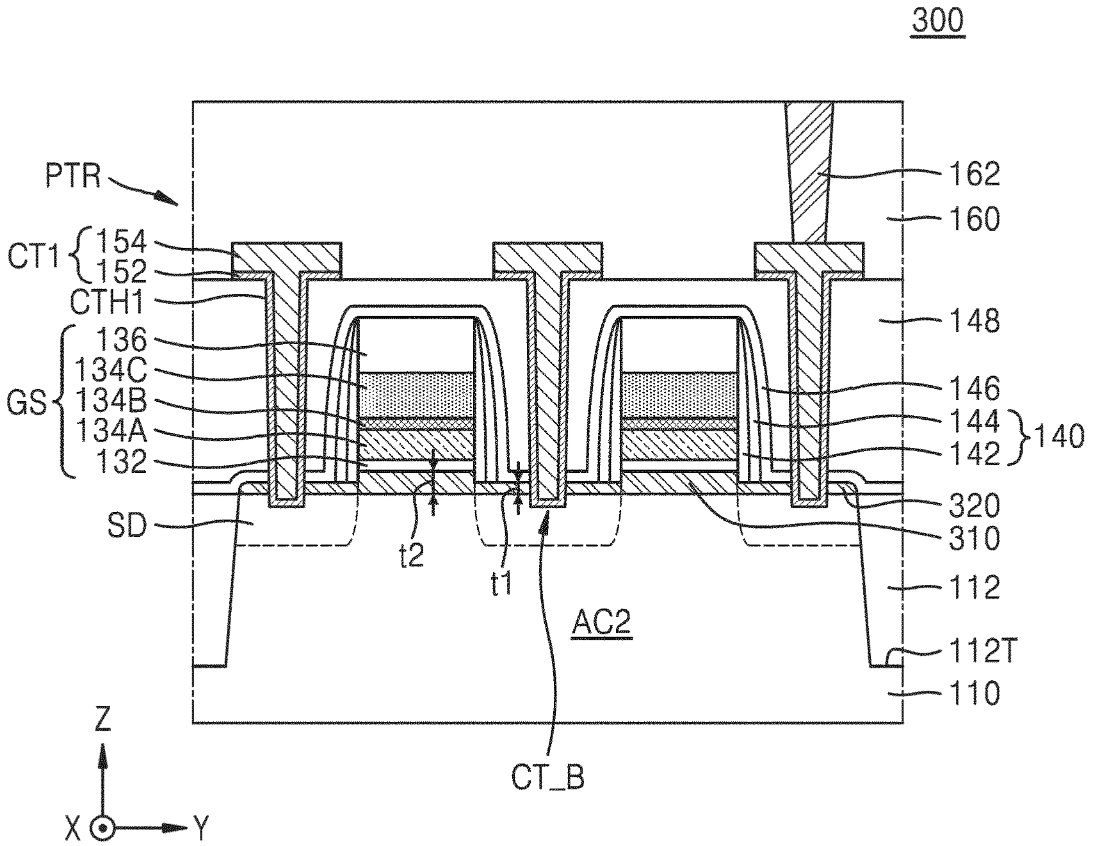
FIG. 8 is a cross-sectional view illustrating an integrated circuit device according to some example embodiments.

FIG. 8 is a cross-sectional view illustrating an integrated circuit device 300 according to some example embodiments.

Referring to FIG. 8, a channel layer 310 may be disposed between the gate stack GS and the substrate 110, and a gate insulating layer 132 may be disposed on the channel layer 310. The channel layer 310 may include silicon germanium. The channel layer 310 may act as a channel area of the peripheral circuit transistor PTR together with a portion of the substrate 110 under the channel layer 310.

In some example embodiments, the channel layer 310 may be integrally connected to a cover semiconductor layer 320. The channel layer 310 may have a second thickness t1 that is greater than the first thickness t2 in the vertical direction Z of the cover semiconductor layer 320. The bottom surface of the channel layer 310 may be at the same level as the bottom surface of the cover semiconductor layer 320, and the upper surface of the channel layer 310 may be at a level higher than the upper surface of the cover semiconductor layer 320. In some example embodiments, the bottom surface of the inner spacer 142 and the bottom surface of the outer spacer 144 may be on the upper surface of the cover semiconductor layer 320.

In embodiments, in the process of forming the channel layer 310 (see FIG. 20) on the second active area AC2 of the substrate 110 and patterning the gate stack GS on the channel layer 310, a portion of the channel layer 310 outside the gate stack GS (planarly surrounding the gate stack GS) may remain to form the cover semiconductor layer 320.

FIG. 8 illustrates as an example the case where the inner spacer 142 are disposed on both sidewalls of the channel layer 310, but in other embodiments, the inner spacer 142 may be disposed on the upper surface of the channel layer 310 and the outer spacer 144 may be disposed on both sidewalls of the channel layer 310.

The contact CT1 may pass through the first interlayer insulating film 148, the protective layer 146, and the cover semiconductor layer 320 and may be disposed on the upper surface of the source/drain area SD. Compared to silicon, since the diffusion of impurities such as carrier diffusion is small in the cover semiconductor layer 320 including silicon germanium disposed on the source/drain area SD (e.g., boron (B) included in the cover semiconductor layer 320, and the sidewall of the bottom portion CT_B of the contact CT1 is surrounded by the cover semiconductor layer 320, resistance of the contact CT1 may be reduced.

Figure 9:
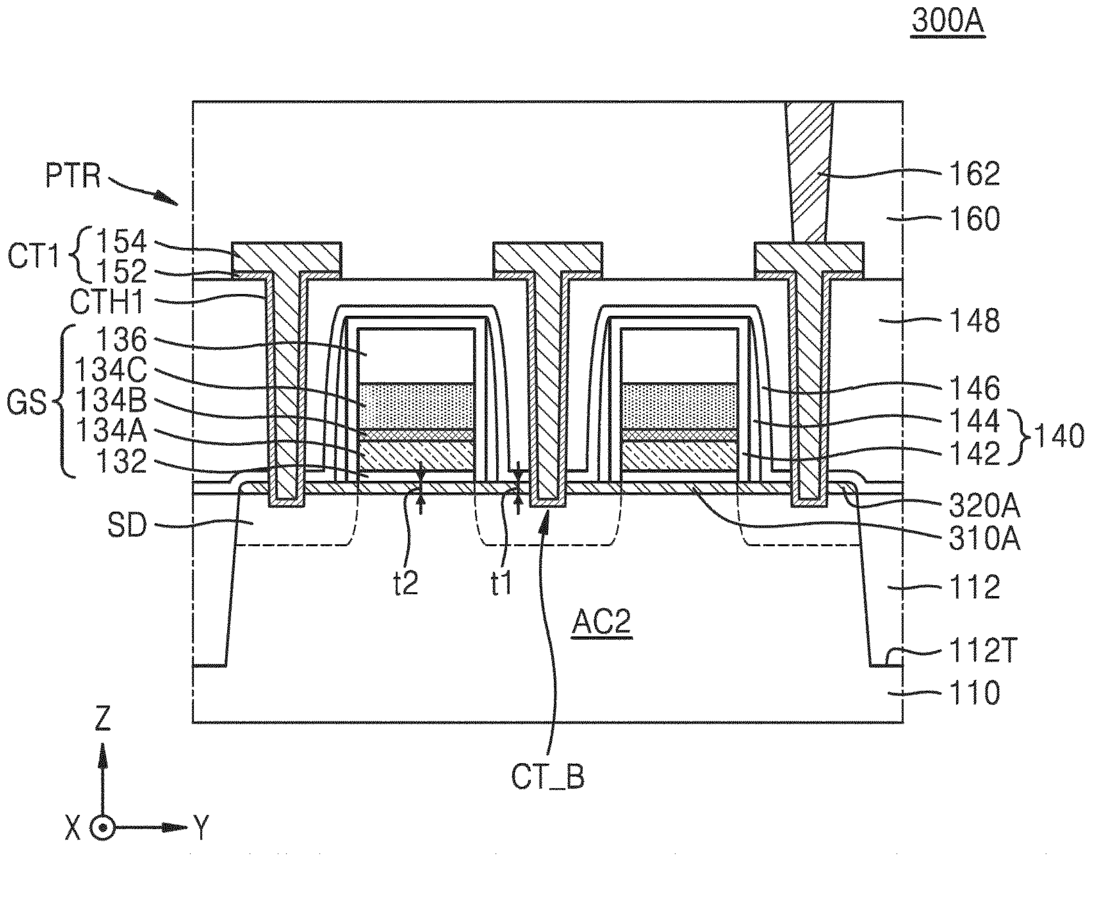
FIG. 9 is a cross-sectional view illustrating an integrated circuit device according to some example embodiments.

FIG. 9 is a cross-sectional view illustrating an integrated circuit device 300A according to various example embodiments.

Referring to FIG. 9, a channel layer 310A may be integrally connected to a cover semiconductor layer 320A. The channel layer 310A may have a second thickness t2 that is substantially equal to the first thickness t1 of the cover semiconductor layer 320A in the vertical direction Z. For example, the bottom surface of the channel layer 310A may be at the same level as the bottom surface of the cover semiconductor layer 320, and an upper surface of the channel layer 310A may be at a level higher than an upper surface of the cover semiconductor layer 320A.

In some example embodiments, the inner spacer 142 may extend onto the upper surface of the cover semiconductor layer 320A on both sidewalls of the gate stack GS and may extend onto the upper surface of the element isolation film 112. The inner spacer 142 may extend onto the upper surface of the gate capping layer 136 on both sidewalls of the gate stack GS.

In some example embodiments, in the process of forming the channel layer 310 (see FIG. 20) on the second active area AC2 of the substrate 110 and patterning the gate stack GS on the channel layer 310, a portion of the channel layer 310 outside the gate stack GS (planarly surrounding the gate stack GS) may remain to form the cover semiconductor layer 320A. In this case, the cover semiconductor layer 320A may hardly be etched in the patterning process, and the cover semiconductor layer 320A may remain with substantially the same thickness as the channel layer 310A.

Figure 10:
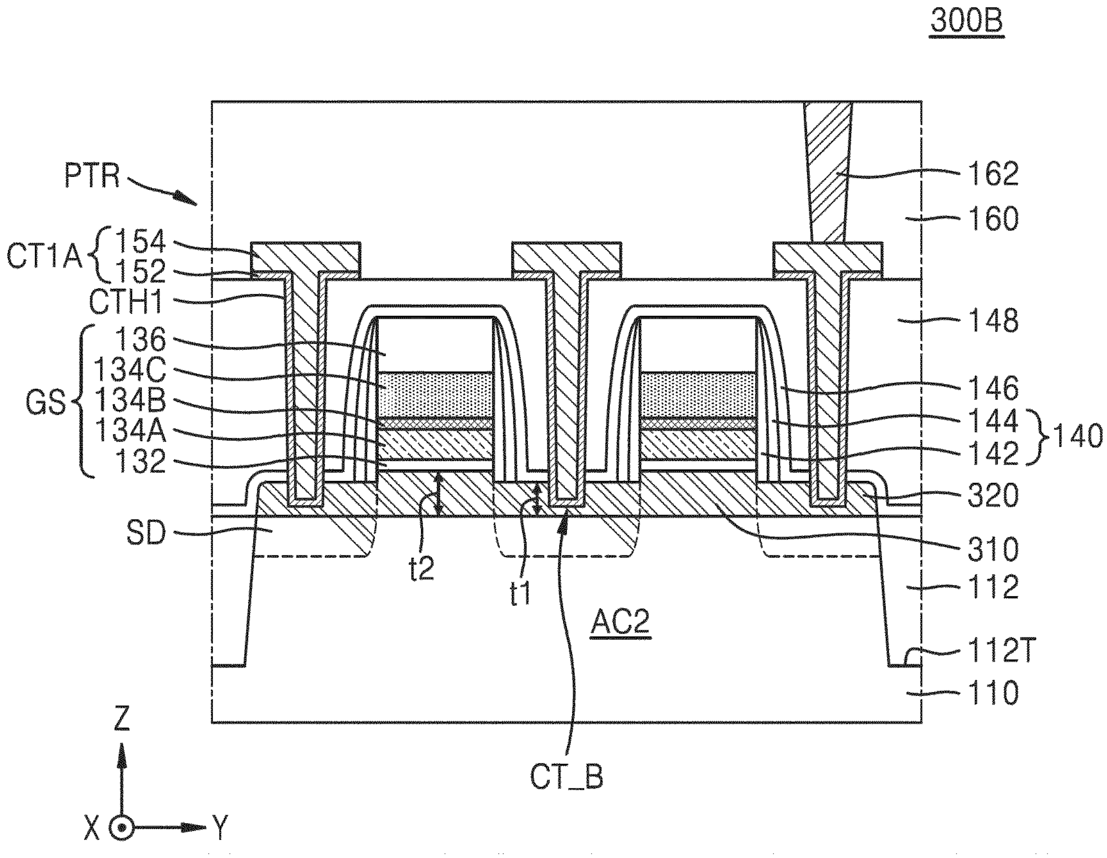
FIG. 10 is a cross-sectional view illustrating an integrated circuit device according to some example embodiments.

FIG. 10 is a cross-sectional view illustrating an integrated circuit device 300B according to various example embodiments.

Referring to FIG. 10, the channel layer 310 may be integrally connected to the cover semiconductor layer 320. The channel layer 310 may have a second thickness t2 that is greater than the first thickness t1 in the vertical direction Z of the cover semiconductor layer 320. The bottom surface of the channel layer 310 may be at the same level as the bottom surface of the cover semiconductor layer 320, and the upper surface of the channel layer 310 may be at a level higher than the upper surface of the cover semiconductor layer 320. In some example embodiments, the bottom surface of the inner spacer 142 and the bottom surface of the outer spacer 144 may be on the upper surface of the cover semiconductor layer 320.

The contact CT1A may pass through the first interlayer insulating film 148 and the protective layer 146 and may be disposed on the upper surface of the cover semiconductor layer 320. Compared to silicon, since the cover semiconductor layer 320 including silicon germanium disposed on the source/drain area SD has small carrier diffusion (e.g., diffusion of impurities such as boron (B) included in the cover semiconductor layer 320), and the bottom portion CT_B of the contact CT1A is surrounded by the cover semiconductor layer 320, resistance of the contact CT1A may be reduced. This may improve electrical performance such as speed and/or power.

Figure 11:
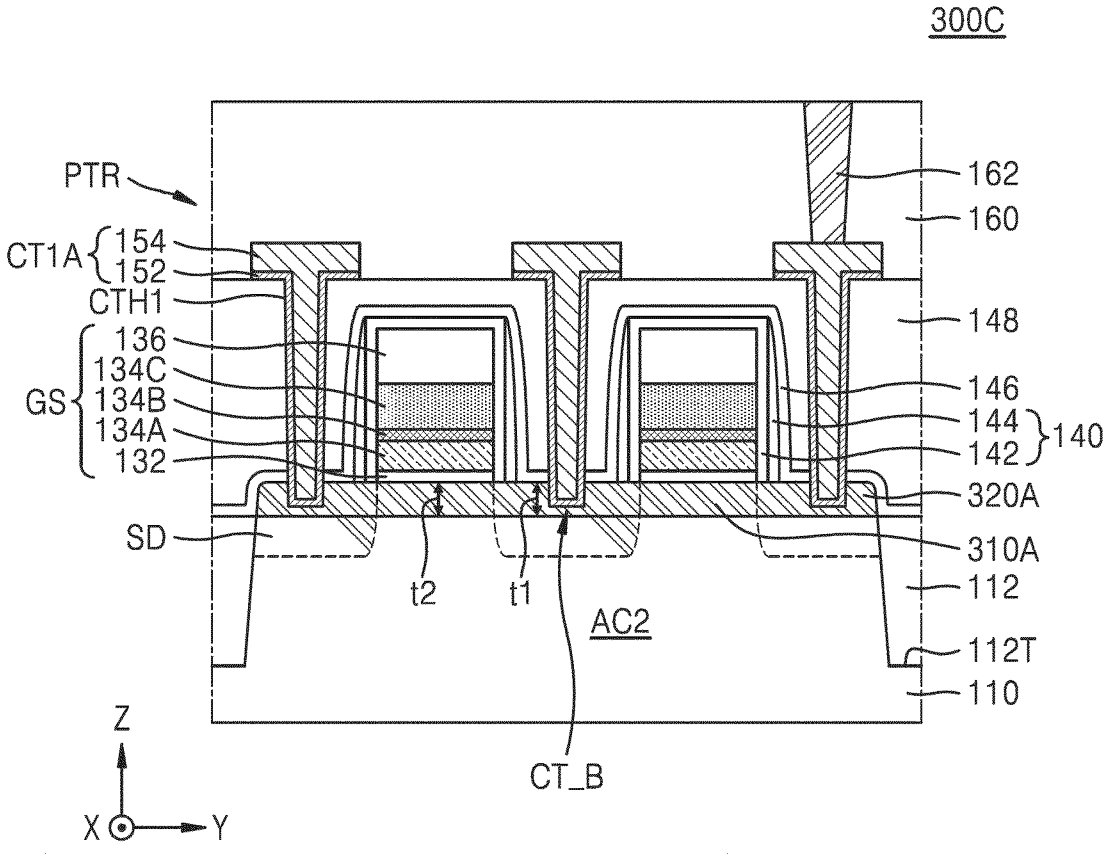
FIG. 11 is a cross-sectional view illustrating an integrated circuit device according to some example embodiments.

FIG. 11 is a cross-sectional view illustrating an integrated circuit device 300C according to some example embodiments.

Referring to FIG. 11, the channel layer 310A may be integrally connected to the cover semiconductor layer 320A, and the channel layer 310A may have a second thickness t2 that is substantially equal to the first thickness t1 of the cover semiconductor layer 320A in the vertical direction Z.

The contact CT1A may pass through the first interlayer insulating film 148 and the protective layer 146 and may be disposed on the upper surface of the cover semiconductor layer 320A. Compared to silicon, since the cover semiconductor layer 320A including silicon germanium disposed on the source/drain area SD has small carrier diffusion (e.g., diffusion of impurities such as boron (B) included in the cover semiconductor layer 320A), and the bottom portion CT_B of the contact CT1A is surrounded by the cover semiconductor layer 320A, resistance of the contact CT1A may be reduced.

Figure 12:
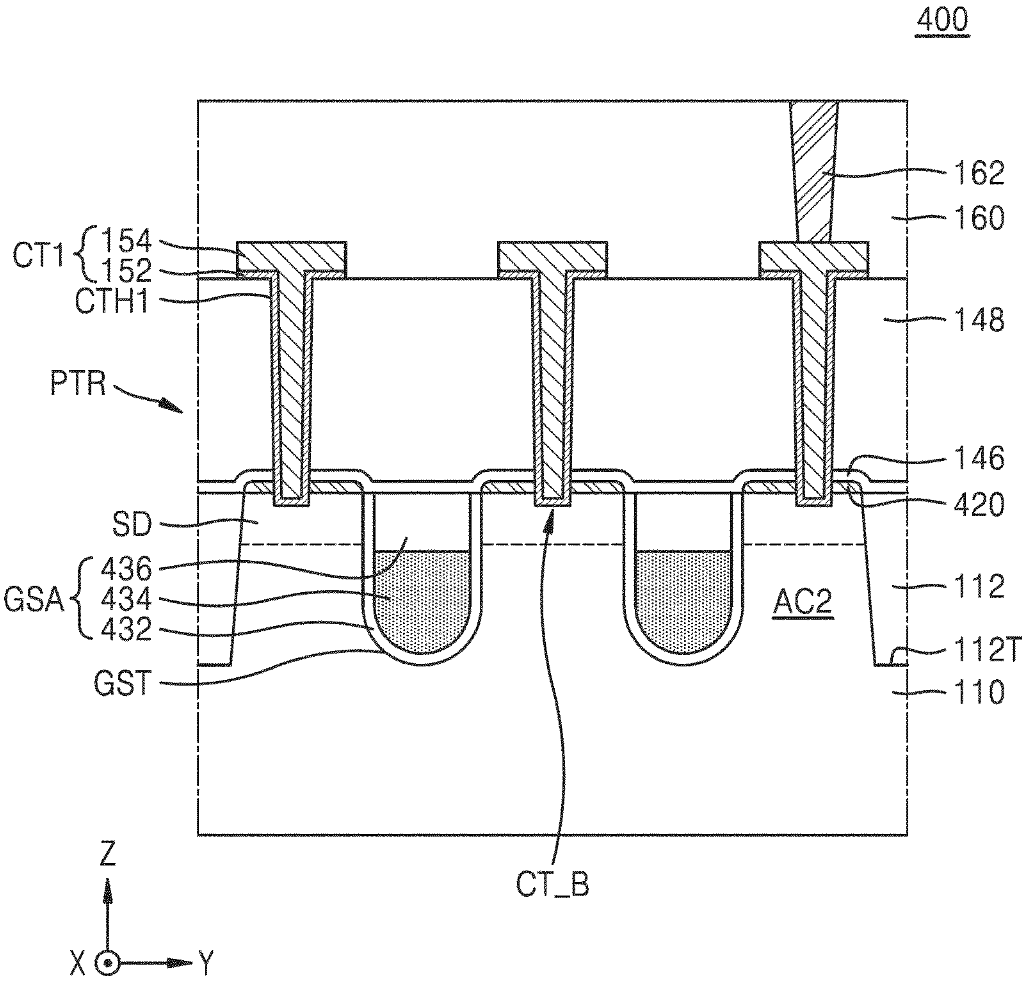
FIG. 12 is a cross-sectional view illustrating an integrated circuit device according to some example embodiments.

FIG. 12 is a cross-sectional view illustrating an integrated circuit device 400 according to various example embodiments.

Referring to FIG. 12, the peripheral circuit transistor PTR may include a recess-type transistor. For example, a gate trench GST extending into the substrate 110 may be formed, and a gate stack GSA may be disposed in the gate trench GST. As shown in FIG. 12, the gate stack GSA may include a gate insulating layer 432 disposed on the inner wall of the gate trench GST, a gate electrode 434 filling the lower side of the gate trench GST on the gate insulating layer 432, and a gate capping layer 436 filling the upper side of the gate trench GST on the gate insulating layer 432.

A source/drain area SD may be disposed on the upper portion of the substrate on both sides of the gate trench GST. A cover semiconductor layer 420 may be disposed on the source/drain area SD. The cover semiconductor layer 420 may be formed on the entire upper surface of the second active area AC2 except for an area where the gate trench GST is disposed. In some example embodiments, the cover semiconductor layer 420 may include silicon germanium, and the source/drain area SD may include silicon doped with impurities.

In some example embodiments, after forming the gate stack GSA in the gate trench GST of the second active area AC2, the cover semiconductor layer 420 may be formed on the exposed upper surface of the second active area AC2 by an epitaxial growth process. Alternatively or additionally in some example embodiments, the cover semiconductor layer 420 is first formed on the entire upper surface of the second active area AC2, and thereafter, a gate trench GST may be formed by removing portions of the cover semiconductor layer 420 and the substrate 110, and a gate stack GSA may be formed in the gate trench GST.

The protective layer 146 may be conformally disposed on the gate stack GSA and the cover semiconductor layer 420, and the first interlayer insulating film 148 may cover the gate stack GSA and the cover semiconductor layer 420 on the protective layer 146. The contact CT1 may be electrically connected to the source/drain area SD by penetrating the first interlayer insulating film 148, the protective layer 146, and the cover semiconductor layer 420. For example, a sidewall of the bottom portion CT_B of the contact CT1 may be surrounded by the cover semiconductor layer 420 and the bottom surface of the contact CT1 may be at a level lower than the bottom surface of the cover semiconductor layer 420. In other embodiments, unlike that shown in FIG. 12, the contact CT1 may pass through the first interlayer insulating film 148 and the protective layer 146 and contact the upper surface of the cover semiconductor layer 420, and for example, the bottom surface of the contact CT1 may be at a level higher than the bottom surface of the cover semiconductor layer 420 and lower than the upper surface of the cover semiconductor layer 420.

With respect to FIG. 12, the peripheral circuit transistor PTR of a recess type in which the gate stack GS is disposed in the gate trench GST extending into the substrate 110 has been described, but in some example embodiments, the peripheral circuit transistor PTR may be implemented as a FinFET transistor. In this case, for example, a fin-type active area protruding in the vertical direction Z is provided on the substrate 110, a gate stack GSA is disposed on the fin-type active area in a direction crossing the fin-type active area, and a source/drain area SD and a cover semiconductor layer 420 may be disposed on the fin-type active area on both sides of the gate stack GSA.

Figure 13:
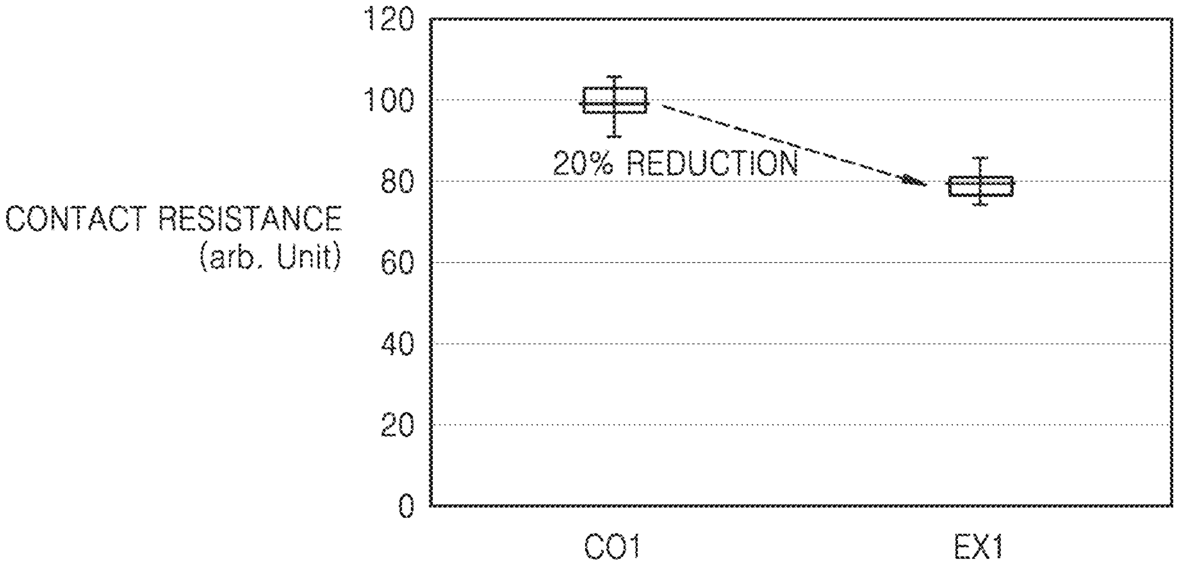
FIG. 13 is a graph showing contact resistance of an integrated circuit device according to some example embodiments.

FIG. 13 is a graph showing contact resistance of an integrated circuit device according to some example embodiments.

FIG. 13 shows the simulated contact resistance of an integrated circuit device according to an example Embodiment EX1 together with the simulated contact resistance of an integrated circuit device according to Comparative Example CO1. Example Embodiment EX1 has the same structure as the integrated circuit device 100 described with reference to FIG. 3 and Comparative Example CO1 has a structure similar to Embodiment EX1 except that the cover semiconductor layer 120 is omitted. As shown in FIG. 13, the contact resistance of Embodiment EX1 is reduced by about 20% compared to that of Comparative Example CO1. This is because the diffusivity (e.g., diffusivity of impurities such as boron (B)) of carriers is reduced in the cover semiconductor layer 120 (see FIG. 3) including silicon germanium compared to the source/drain area SD (see FIG. 3) and accordingly, it may be assumed that ohmic contact characteristics are improved by the further increased carrier concentration in the cover semiconductor layer 120 and thus reduced contact resistance is obtained.

FIGS. 14 to 19 are cross-sectional views illustrating a manufacturing method of the integrated circuit device 100, according to some example embodiments.

Figure 14:
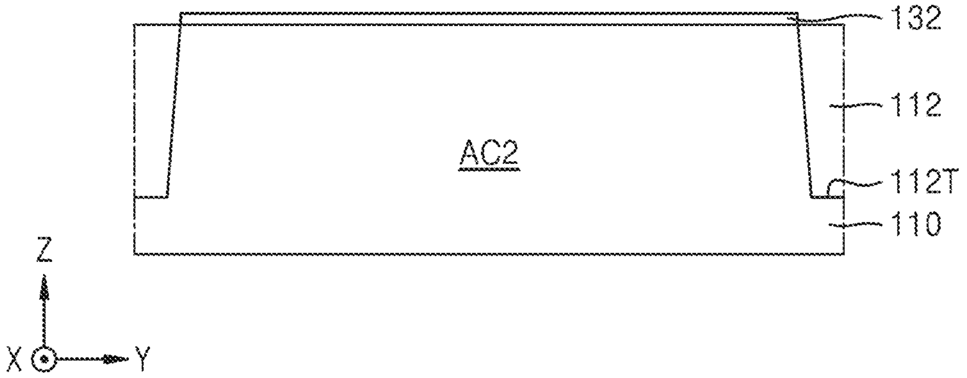
FIGS. 14 to 19 are cross-sectional views illustrating a method of manufacturing an integrated circuit device, according to some example embodiments.

Referring to FIG. 14, a plurality of element isolation trenches 112T are formed in the cell array area MCA (see FIG. 2) and the peripheral circuit area PCA of a substrate 110, and an element isolation film 112 filling the plurality of element isolation trenches 112T may be formed in the cell array area MCA and the peripheral circuit area PCA. By forming the element isolation film 112, a plurality of first active areas AC1 (see FIG. 2) are defined in the cell array area MCA of the substrate 110 and a second active area AC2 is defined in the peripheral circuit area PCA.

In some example embodiments, the element isolation film 112 may be formed using silicon oxide, silicon nitride, silicon oxynitride, or a combination thereof. In some example embodiments, the element isolation film 112 may be formed having a double layer structure of a silicon oxide layer and a silicon nitride layer but is not limited thereto.

Although not shown, a word line trench may be formed by removing a portion of the substrate 110 from the cell array area MCA, and the word line WL may be formed in the word line trench.

Thereafter, a gate insulating layer 132 may be formed on the substrate 110 in the peripheral circuit area PCA. In some example embodiments, the gate insulating layer 132 may be formed on the exposed surface of the second active area AC2 and may not be formed on the element isolation film 112. In some example embodiments, the gate insulating layer 132 may be formed on the exposed surface of the second active area AC2 and the upper surface of the element isolation film 112.

Figure 15:
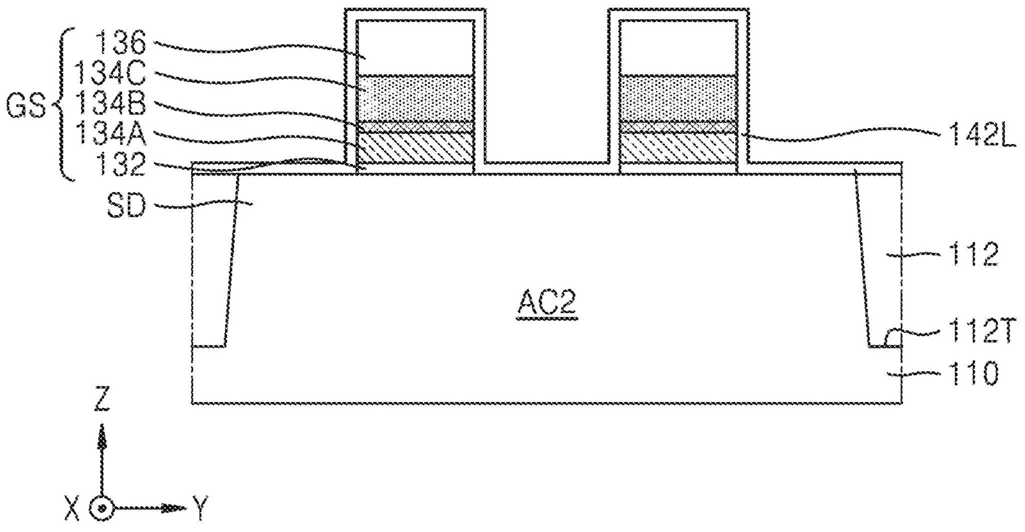

Referring to FIG. 15, a bit line BL (see FIG. 2) and a gate stack GS may be formed on the substrate 110 in the cell array area MCA and the peripheral circuit area PCA, respectively.

In some example embodiments, the gate stack GS may include a gate insulating layer 132, a first gate electrode 134A, a second gate electrode 134B, a third gate electrode 134C, and a gate capping layer 136 sequentially disposed on the second active area AC2.

In some example embodiments, after sequentially forming a first gate electrode layer, a second gate electrode layer, a third gate electrode layer, and a gate capping material layer on the substrate 110, by patterning the first gate electrode layer, the second gate electrode layer, the third gate electrode layer, and the gate capping material layer, the gate stack GS may be formed on the peripheral circuit area PCA and the bit line BL may be formed on the cell array area MCA. For example, in the patterning process, the gate insulating layer 132 is also patterned so that a portion of an upper surface of the second active area AC2 may be exposed without being covered by the gate insulating layer 132. In other embodiments, the bit line BL may be formed on the cell array area MCA, and then the gate stack GS may be formed on the peripheral circuit area PCA.

Thereafter, an inner spacer layer 142L conformally covering the gate stack GS may be formed. The inner spacer layer 142L may be formed using a first insulating material, and the first insulating material may include silicon nitride.

Figure 16:
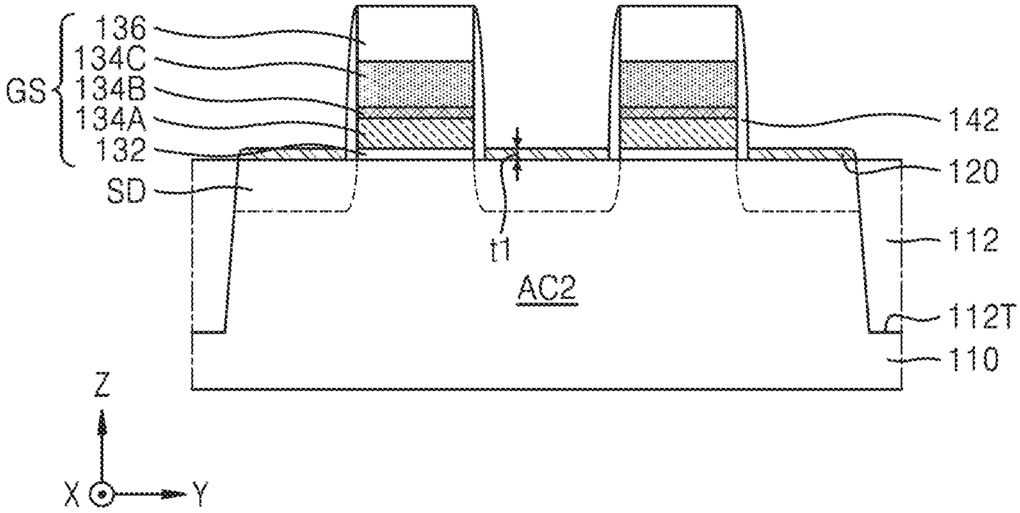

Referring to FIG. 16, an anisotropic etching process may be performed on the inner spacer layer 142L to form an inner spacer 142 on both sidewalls of the gate stack GS. A portion of an upper surface of the second active area AC2 that is not covered by the gate stack GS and the inner spacer 142 may be exposed again by the anisotropic etching process.

In some example embodiments, after forming the inner spacer 142, impurities may be implanted into the second active area AC2 by an ion implantation process to form a source/drain area SD. In other embodiments, before forming the inner spacer 142, the source/drain area SD may be formed by implanting impurities into the second active area AC2 through an ion implantation process.

Then, the cover semiconductor layer 120 may be formed on the upper surface of the second active area AC2 that is not covered by the gate stack GS and the inner spacer 142.

In some example embodiments, the cover semiconductor layer 120 may include silicon germanium and may be formed by an epitaxial growth process. The epitaxy growth process may be or include one or more of vapor-phase epitaxy (VPE), a chemical vapor deposition (CVD) process such as ultra-high vacuum (UHV)-CVD, molecular beam epitaxy, or a combination thereof. In the epitaxial growth process, a liquid and/or gaseous precursor may be used as a precursor required for forming the cover semiconductor layer 120.

In some example embodiments, the cover semiconductor layer 120 may be formed using an exposed upper surface of the second active area AC2 as a seed layer and accordingly, the cover semiconductor layer 120 may not be formed on the upper surface of the element isolation film 112. The cover semiconductor layer 120 may be formed to be in contact with the outer wall of the inner spacer 142 and to cover the entire upper surface of the second active area AC2 that is not covered by the gate stack GS and the inner spacer 142.

In some example embodiments, the cover semiconductor layer 120 may be formed to have a first thickness t1 of 100 angstroms or less.

Figure 17:
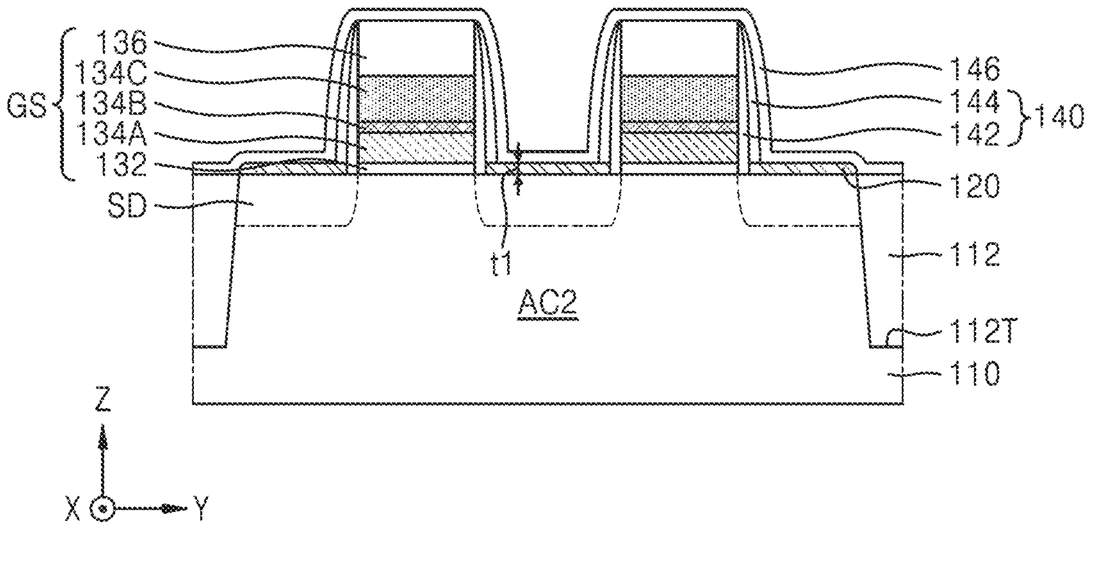

Referring to FIG. 17, an outer spacer layer (not shown) may be formed on the substrate 110 to cover the gate stack GS and the inner spacer 142, and an anisotropic etching process may be performed on the outer spacer layer to form an outer spacer 144 on both sidewalls of the gate stack GS.

The outer spacer 144 may include a second insulating material, and the second insulating material may include silicon oxide but is not limited thereto. A bottom surface of the outer spacer 144 may be disposed on an upper surface (e.g., the upper surface of a portion of the cover semiconductor layer 120 disposed adjacent to the gate stack GS) of the cover semiconductor layer 120.

Thereafter, a protective layer 146 conformally covering the gate stack GS, the inner spacer 142, and the outer spacer 144 may be formed. The protective layer 146 may cover the upper surface of the cover semiconductor layer 120.

Figure 18:
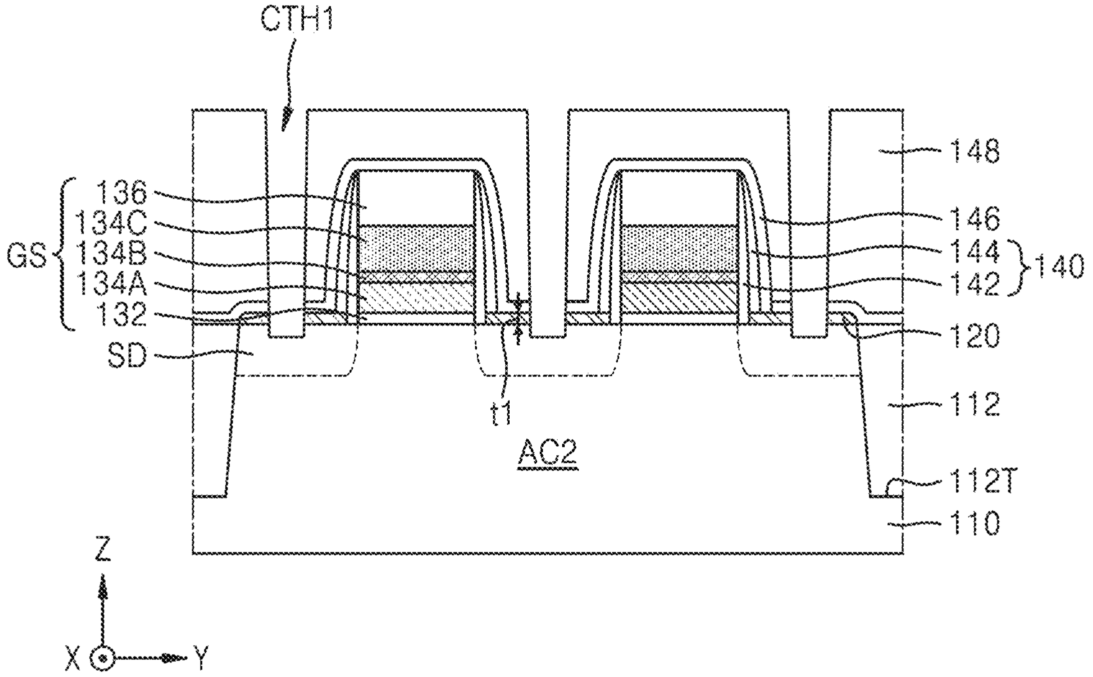

Referring to FIG. 18, a first interlayer insulating film 148 may be formed on the protective layer 146. The first interlayer insulating film 148 may be formed to a height sufficient to completely cover the gate stack GS.

Thereafter, a mask pattern (not shown) is formed on the first interlayer insulating film 148, and by using the mask pattern as an etching mask, a contact hole CTH1 may be formed by removing portions of the first interlayer insulating film 148, the protective layer 146, and the cover semiconductor layer 120. The contact hole CTH1 may pass through the cover semiconductor layer 120, and an upper surface of the source/drain area SD may be exposed at a bottom portion of the contact hole CTH1.

Figure 19:
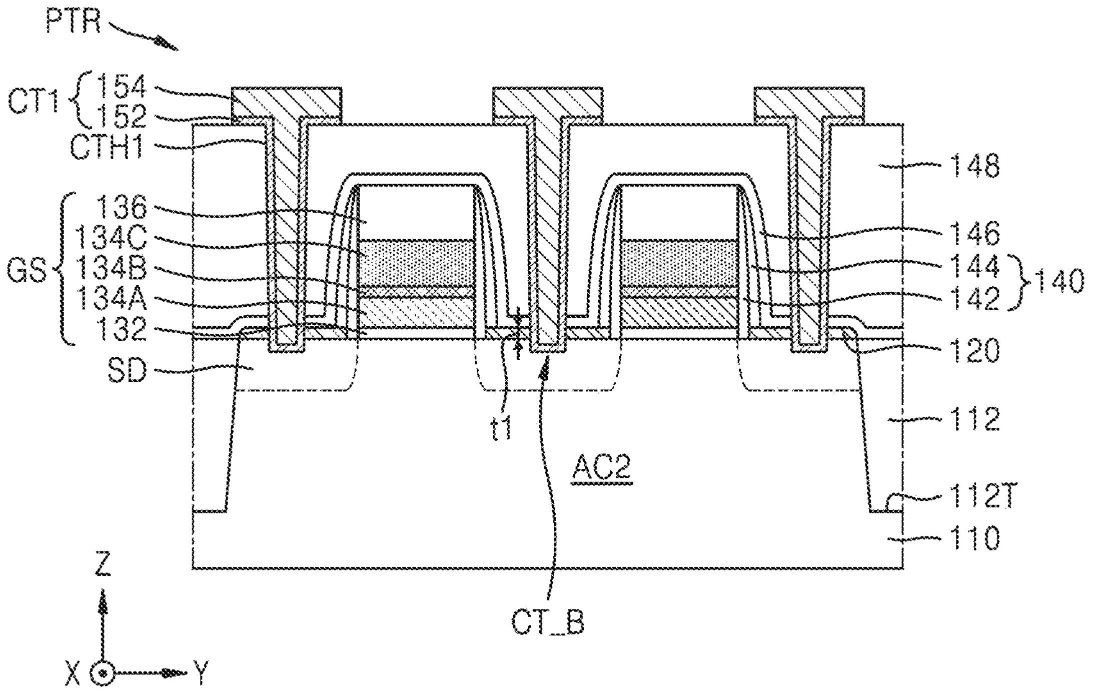

Referring to FIG. 19, a contact CT1 including a conductive barrier 152 and a contact conductive layer 154 is formed on an inner wall of the contact hole CTH1.

In some example embodiments, the conductive barrier 152 may include at least one of ruthenium (Ru), titanium (Ti), titanium nitride (TiN), tantalum (Ta), tantalum nitride (TaN), tungsten (W), titanium silicon nitride (TiSiN), titanium silicide (TiSi), and tungsten silicide (WSi). The contact conductive layer 154 may include at least one of tungsten (W), cobalt (Co), molybdenum (Mo), nickel (Ni), ruthenium (Ru), copper (Cu), aluminum (Al), silicides thereof, or alloys thereof.

Referring back to FIG. 3, a second interlayer insulating film 160 may be formed on the first interlayer insulating film 148 and the contact CT1, and an upper contact 162 electrically connected to the contact CT1 may be formed through the second interlayer insulating film 160.

The integrated circuit device 100 may be completed by performing the above method.

According to the manufacturing method according to various example embodiments, a cover semiconductor layer 120 including silicon germanium may be formed on the upper surface of the second active area AC2, and an ohmic resistance characteristic between the cover semiconductor layer 120 and the contact CT1 may be improved, and thus, the contact resistance of the peripheral circuit transistor PTR may be reduced.

In some example embodiments, the cover semiconductor layer 120A may be formed after forming the outer spacer 144. In this case, the cover semiconductor layer 120A may be formed to contact the outer wall of the outer spacer 144, and the integrated circuit device 100A described with reference to FIG. 4 may be manufactured.

In some example embodiments, before forming the conductive barrier 152 on the inner wall of the contact hole CTH1, a metal silicide layer 156 (see FIG. 5) may be further formed on the surface of the source/drain area SD exposed to the bottom portion of the contact hole CTH1. In this case, the integrated circuit device 100B described with reference to FIG. 5 may be manufactured.

In some example embodiments, the cover semiconductor layer 220 may be formed to have a relatively large first thickness t1, and in an etching process for forming the contact hole CTH1, the contact hole CTH1 may be formed to have a depth that does not completely penetrate the cover semiconductor layer 220. In this case, the bottom surface of the contact CT1A may be formed to contact the upper surface of the cover semiconductor layer 220, and the integrated circuit devices 200 and 200A described with reference to FIGS. 6 and 7 may be manufactured.

Figure 20:
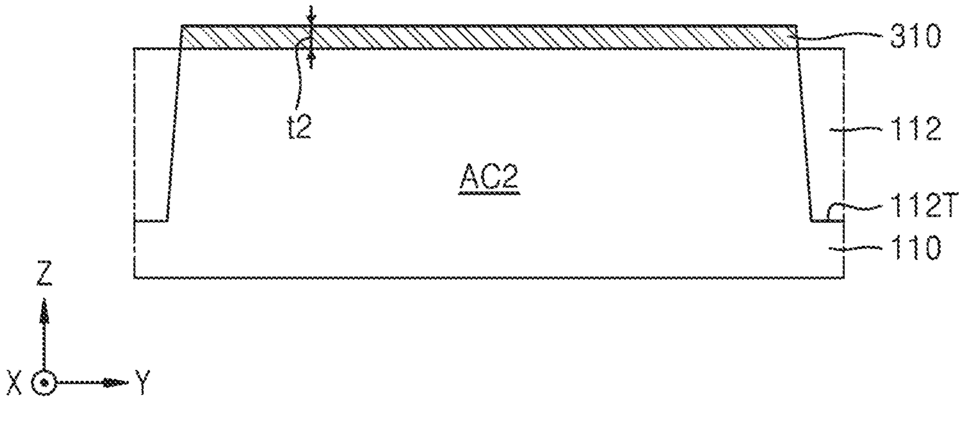
FIGS. 20 and 21 are cross-sectional views illustrating a method of manufacturing an integrated circuit device, according to some example embodiments.
Figure 21:
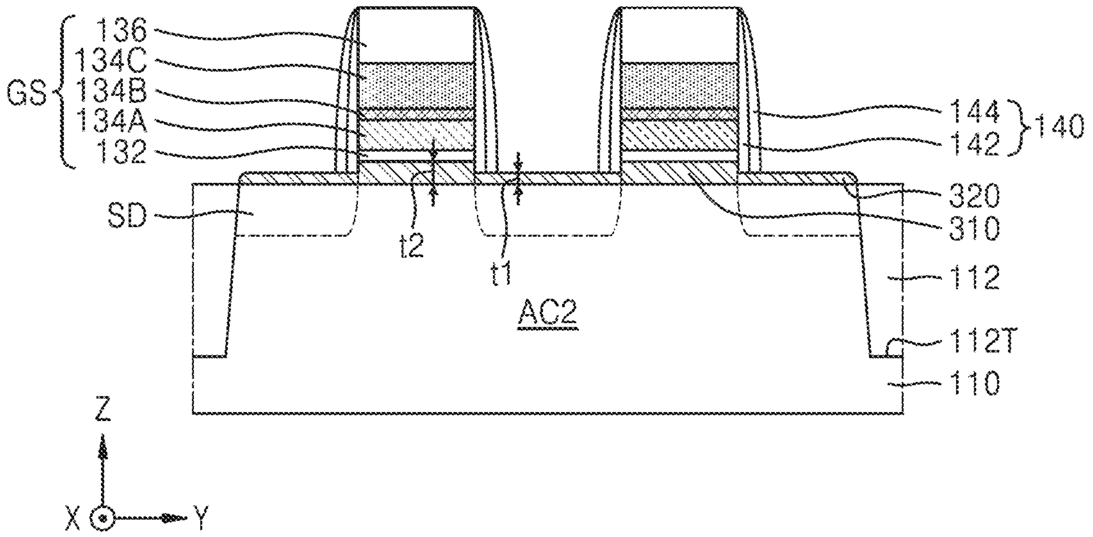

FIGS. 20 and 21 are cross-sectional views illustrating a manufacturing method of the integrated circuit device 300, according to some example embodiments.

Referring to FIG. 20, a channel layer 310 may be formed on the substrate 110. For example, the channel layer 310 may be formed by an epitaxial growth process and may include silicon germanium. The channel layer 310 may be formed to have a second thickness t2 on the exposed upper surface of the second active area AC2 and may not be formed on the upper surface of the element isolation film 112.

Referring to FIG. 21, a gate stack GS may be formed on the channel layer 310. In embodiments, after sequentially forming the gate insulating layer 132, the first gate electrode layer, the second gate electrode layer, the third gate electrode layer, and the gate capping material layer on the channel layer 310 to form the gate stack GS, the gate insulating layer 132, the first gate electrode layer, the second gate electrode layer, the third gate electrode layer, and the gate capping material layer may be patterned.

In the patterning process, a portion of the channel layer 310 not covered by the gate stack GS may remain. Here, a portion of the channel layer 310 not covered by the gate stack GS may be referred to as a cover semiconductor layer 320. For example, in the patterning process, a portion of the thickness of the portion of the channel layer 310 not covered by the gate stack GS may be removed and accordingly, the cover semiconductor layer 320 may have a first thickness t1 that is less than the second thickness t2 of the channel layer 310.

Thereafter, an inner spacer 142 and an outer spacer 144 may be sequentially formed on both sidewalls of the gate stack GS.

Subsequently, the integrated circuit device 300 may be completed by performing the processes described with reference to FIGS. 18 and 19.

In some example embodiments, a portion of the channel layer 310A not covered by the gate stack GS may hardly be removed in a patterning process for forming the gate stack GS. In this case, the channel layer 310A and the cover semiconductor layer 320A may be formed to have substantially the same thickness, and the integrated circuit device 300A described with reference to FIG. 9 may be completely formed.

While various inventive concepts have been particularly shown and described with reference to various example embodiments thereof, it will be understood that various changes in form and details may be made therein without departing from the spirit and scope of the following claims. Furthermore, example embodiments are not necessarily mutually exclusive with one another. For example, some example embodiments may include one or more features described with reference to one or more figures and may also include one or more other features described with reference to one or more other figures.

What is claimed is:

1. An integrated circuit device comprising:

a gate stack on a substrate;

a spacer on first and second sidewalls of the gate stack;

a source/drain area in an upper portion of the substrate on first and second sides of the gate stack;

a cover semiconductor layer on the source/drain area;

an interlayer insulating film on the cover semiconductor layer and surrounding sidewalls of the gate stack; and a contact in a contact hole that penetrates the interlayer insulating film and the cover semiconductor layer, the contact having a bottom portion contacting the cover semiconductor layer and the source/drain area and within the upper portion of the substrate.

2. The integrated circuit device of claim 1, wherein the cover semiconductor layer comprises silicon germanium (SiGe), and the source/drain area comprises silicon doped with impurities.

3. The integrated circuit device of claim 1, wherein a bottom surface of the contact is below a bottom surface of the cover semiconductor layer.

4. The integrated circuit device of claim 1, wherein an upper surface of the cover semiconductor layer is covered by the interlayer insulating film.

5. The integrated circuit device of claim 1, wherein the spacer comprises:

an inner spacer on the first and second sidewalls of the gate stack; and an outer spacer on the inner spacer on the first and second sidewalls of the gate stack, wherein the cover semiconductor layer is in contact with an outer wall of the inner spacer.

6. The integrated circuit device of claim 5, wherein a bottom surface of the outer spacer is on the cover semiconductor layer.

7. The integrated circuit device of claim 5, wherein a bottom surface of the outer spacer is above the bottom surface of the inner spacer, wherein at least a portion of the cover semiconductor layer vertically overlaps the outer spacer.

8. The integrated circuit device of claim 1, wherein the spacer comprises:

an inner spacer on the first and second sidewalls of the gate stack; and an outer spacer on the inner spacer on the first and second sidewalls of the gate stack, wherein the cover semiconductor layer is in contact with an outer wall of the outer spacer.

9. The integrated circuit device of claim 8, wherein the cover semiconductor layer does not contact the inner spacer.

10. The integrated circuit device of claim 1, further comprising:

a channel layer between the substrate and the gate stack and including silicon germanium, wherein the channel layer is integrally connected to the cover semiconductor layer.

11. An integrated circuit device comprising:

a gate stack on a substrate, the gate stack including a gate insulating layer, a gate electrode, and a gate capping layer;

a spacer including an inner spacer and an outer spacer that are sequentially arranged on first and second sidewalls of the gate stack;

a source/drain area on at least one side of the gate stack and within an upper portion of the substrate;

a cover semiconductor layer on the source/drain area and contacting at least a portion of the spacer;

an interlayer insulating film on the cover semiconductor layer and an outer wall of the spacer; and a contact electrically connected to the cover semiconductor layer and the source/drain area, the contact penetrating through the interlayer insulating film, the contact within the upper portion of the substrate.

12. The integrated circuit device of claim 11, wherein the contact is in a contact hole penetrating the interlayer insulating film and the cover semiconductor layer, a bottom surface of the contact is on an upper surface of the source/drain area, and a sidewall of a bottom portion of the contact is surrounded by the cover semiconductor layer.

13. The integrated circuit device of claim 11, wherein the cover semiconductor layer contacts an outer wall of the inner spacer, and a bottom surface of the outer spacer is on the cover semiconductor layer.

14. The integrated circuit device of claim 13, wherein the bottom surface of the outer spacer is above a bottom surface of the inner spacer, and at least a portion of the cover semiconductor layer vertically overlaps the outer spacer.

15. The integrated circuit device of claim 11, wherein the cover semiconductor layer contacts an outer wall of the outer spacer, and the cover semiconductor layer does not contact the inner spacer.

16. The integrated circuit device of claim 11, wherein a bottom surface of the contact is below an upper surface of the source/drain area.

17. The integrated circuit device of claim 11, further comprising:

an element isolation film on the substrate and defining an active area, wherein the cover semiconductor layer covers an entire upper surface of the active area not covered by the gate stack and the spacer, and the cover semiconductor layer is not on the element isolation film.

18. The integrated circuit device of claim 11, wherein the cover semiconductor layer comprises silicon germanium (SiGe), and wherein the source/drain area comprises silicon doped with impurities.

19. An integrated circuit device comprising:

an element isolation film on a substrate and defining an active area;

a gate stack on the active area of the substrate, the gate stack including a gate insulating layer, a gate electrode, and a gate capping layer;

a spacer on first and second sidewalls of the gate stack;

a source/drain area on at least one side of the gate stack and within the active area;

a cover semiconductor layer on the source/drain area, including silicon germanium, and contacting at least a portion of the spacer;

an interlayer insulating film on the cover semiconductor layer and outer walls of the spacer; and a contact electrically connected to the cover semiconductor layer and the source/drain area, the contact penetrating through the interlayer insulating film, the contact within an upper portion of the substrate.

20. The integrated circuit device of claim 19, wherein a bottom surface of the contact contacts the source/drain area, and the cover semiconductor layer entirely covers a portion of the active area that does not overlap with the gate stack.

* * * * *